United States Patent
Rietzler et al.

(10) Patent No.: US 8,669,910 B2
(45) Date of Patent: Mar. 11, 2014

(54) ANTENNA ARRANGEMENT FOR A CHIP CARD

(75) Inventors: Manfred Rietzler, Marktoberdorf (DE); Raymond Freeman, Mesa, AZ (US)

(73) Assignee: Smartrac IP B.V. (NL)

( * ) Notice: Subject to any disclaimer, the term of this patent is extended or adjusted under 35 U.S.C. 154(b) by 514 days.

(21) Appl. No.: 12/994,089

(22) PCT Filed: Apr. 28, 2009

(86) PCT No.: PCT/EP2009/003070
§ 371 (c)(1),
(2), (4) Date: Mar. 29, 2011

(87) PCT Pub. No.: WO2009/141041
PCT Pub. Date: Nov. 26, 2009

(65) Prior Publication Data
US 2011/0181477 A1    Jul. 28, 2011

(30) Foreign Application Priority Data
May 23, 2008   (DE) .................. 10 2008 024 790

(51) Int. Cl.
*H01Q 9/28*   (2006.01)
(52) U.S. Cl.
USPC ............... 343/795; 343/700 MS; 340/572.7; 235/492
(58) Field of Classification Search
USPC .......... 343/700 MS, 795; 235/492; 340/572.7
See application file for complete search history.

(56) References Cited

U.S. PATENT DOCUMENTS

| 6,057,803 | A | 5/2000 | Kane et al. |
| 7,394,425 | B2 * | 7/2008 | Luch .................. 343/700 MS |
| 7,486,192 | B2 * | 2/2009 | Yamagajo et al. ......... 340/572.7 |
| 7,504,952 | B2 * | 3/2009 | Kaplan et al. ............ 340/572.7 |
| 7,659,863 | B2 * | 2/2010 | Kai et al. ..................... 343/795 |
| 7,954,722 | B2 * | 6/2011 | Sakama ..................... 235/492 |
| 8,237,622 | B2 * | 8/2012 | Furumura et al. ........... 343/895 |

(Continued)

FOREIGN PATENT DOCUMENTS

| CN | 1940976 A | 4/2007 |
| CN | 101025797 A | 8/2007 |

(Continued)

OTHER PUBLICATIONS

International Search Report under date of Sep. 24, 2009 in connection with PCT/EP2009/003070.

(Continued)

*Primary Examiner* — Tho G Phan
(74) *Attorney, Agent, or Firm* — Quarles & Brady LLP

(57) ABSTRACT

An antenna arrangement for a chip card includes an antenna conductor structure that is formed from a surface conductor. The antenna conductor structure includes a dipole arrangement arranged on a card substrate and that has a first antenna strand and a second antenna strand. The antenna conductor structure includes a terminal arrangement connecting the antenna conductor structure to a chip and for forming a transponder including the antenna conductor structure and the chip. A surface of the card substrate is divided into a grasping zone for handling the chip card and a transponder zone for arranging the transponder in such a manner that the grasping zone extends beyond a center region of the substrate surface and at least one lateral edge of the grasping zone is formed by a lateral edge of the substrate surface.

23 Claims, 2 Drawing Sheets

(56) References Cited

U.S. PATENT DOCUMENTS

| | | |
|---|---|---|
| 2002/0034860 A1 | 3/2002 | Miyamoto |
| 2007/0040120 A1 | 2/2007 | Harihara |
| 2008/0122628 A1* | 5/2008 | Kai et al. .................. 340/572.7 |
| 2010/0032487 A1 | 2/2010 | Bohn et al. |

FOREIGN PATENT DOCUMENTS

| | | |
|---|---|---|
| CN | 101083350 A | 12/2007 |
| CN | 201047948 Y | 4/2008 |
| DE | 10 2006 052 517 A1 | 5/2008 |
| EP | 0 451 059 A | 10/1991 |
| EP | 1 826 711 A | 8/2007 |
| FR | 2 874 286 A | 2/2006 |
| JP | 2001022909 A | 1/2001 |
| WO | 93/15418 A | 8/1993 |
| WO | 2005/041121 A | 5/2005 |
| WO | 2007/135269 A | 11/2007 |

OTHER PUBLICATIONS

State Intellectual Property Office of People's Republic of China, First Office Action, Application No. 200980128765.0, Dec. 5, 2012.

* cited by examiner

ANTENNA ARRANGEMENT FOR A CHIP CARD

CROSS REFERENCE TO RELATED APPLICATION

This application claims priority to PCT International Application No. PCT/DE2009/003070 filed on Apr. 28, 2009, which claims priority to German Patent Application No. 10 2008 024 790.1 filed May 23, 2008, both of which are incorporated herein by reference.

STATEMENT REGARDING FEDERALLY SPONSORED RESEARCH OR DEVELOPMENT

Not applicable.

FIELD OF THE INVENTION

The present invention relates to an antenna arrangement for a chip card, comprising an antenna conductor structure that is formed from a surface conductor, wherein the antenna conductor structure comprises a dipole arrangement that is arranged on a card substrate and that has a first antenna strand and a second antenna strand, and the antenna conductor structure comprises a terminal arrangement for connecting the antenna conductor structure to a chip and for forming a transponder comprising the antenna conductor structure and the chip, wherein a surface of the card substrate is divided into a grasping zone for handling the chip card and a transponder zone for arranging the transponder in such a manner that the grasping zone extends beyond a center region of the substrate surface and at least one lateral edge of the grasping zone is formed by a lateral edge of the substrate surface.

BACKGROUND OF THE INVENTION

Antenna arrangements of the above-cited type are utilized in transponders which are operated in the UHF frequency range. In such UHF transponders, the antennas are frequently configured as a dipole antenna having a chip being disposed in the center of the antenna conductor structure and being contacted with the antenna conductor structure via a terminal arrangement.

Such UHF transponders are frequently designed as so-called "tags" which are planarly connected to the surface of the product to be labeled. In this context, for the positioning of tags, such application locations can be formed for the positioning of the tags which are not subjected to the direct manipulation by the person handling the product, i.e. for instance the staff member in wholesale or retail trade reading the transponder data with the aid of a mobile reading device, or the checkout staff reading the transponder data with the aid of a reading device for the purpose of billing. Consequently, the configuration of the transponders in the form of tags in the communication between transponder and reading device in practice scarcely causes any problems.

The situation changes if transponders being equipped with a dipole antenna are disposed in the handling zone and thus complete or partial covering of the dipole antenna by a finger of the person handling the transponder may lead to a detuning of the transponder frequency, and thus may cause a functional disruption in the communication between the transponder and the reading device.

This problem is encountered in particular if transponders being equipped with a dipole antenna are arranged in a chip card, wherein due to the small dimensions of the chip card alone, there is an increased risk that the dipole antenna is at least partially covered during the handling of the card. In a chip card, the central arrangement of the transponder conventionally known from the tags firstly would result in that the chip, and here in particular the mechanically sensitive connecting region of the chip to the dipole antenna, would be arranged in the center of the bending stresses acting on the chip card.

Moreover, the small dimensions of a chip card alone result in that the chip card is regularly held so as to be clamped between the thumb and the index finger and/or the middle finger of the person handling the chip card when the chip card is grasped, in particular in such a manner that the thumb and the finger are allowed to come into abutment essentially in the center region of the chip card surface. When a UHF transponder of the above-cited type is disposed in the central arrangement known from a tag, there is a high risk that at least a partial region of the dipole antenna is covered by the thumb and at least one finger, causing the thus involved detrimental consequences for the communication between the transponder and the reading device.

SUMMARY OF THE INVENTION

Hence, it is an object of the present invention to suggest an antenna arrangement having a dipole antenna for a chip card, wherein the risk of detuning of the transponder is significantly reduced.

In the inventive arrangement, the dipole arrangement of the antenna conductor structure is arranged in a portion of the substrate surface of the card substrate being referred to as "transponder zone" and which is situated remote from a substrate surface being referred to as "grasping zone", so that the risk of parts of the dipole arrangement of the antenna conductor structure being covered when the chip card is grasped is significantly minimized. The aspect that the grasping zone starting from a lateral edge of the substrate extends beyond the center region of the substrate surface allows for grasping the card in a normal manner from at least one lateral edge of the chip card, i.e. by positioning the thumb and at least one finger in the center region of the card, without giving rise to the inevitable consequence that the antenna is detuned.

It proves to be particularly advantageous if a corner region of the grasping zone coincides with a corner region of the substrate surface, since in this way, the card can be grasped not only from at least one lateral edge of the chip card without the risk of a detuning of the antenna, but the card can also be grasped from the side without the risk of such a detuning.

According to another advantageous embodiment, a lateral edge of the grasping zone is defined by a lateral edge of the substrate surface in such a manner that two corner regions of the grasping zone and the substrate surface coincide, which corner regions are connected to one another via the lateral edge of the grasping zone. Such a configuration makes it possible to grasp the card both from a lateral edge and from two adjacent corner regions of the lateral edge without incurring the risk of detuning.

Moreover, the risk of antenna detuning can also be reduced by designing the antenna strands at their free ends as open conductor frames, so that for instance also in the case of an equi-long configuration of the antenna strands, by means of realizing a varying design, respectively size, of the free ends of the antenna strands being configured as open conductor frames, a variable frequency tuning can be performed which is respectively assigned to the antenna strands.

By designing the free antenna ends as conductor frames, it is also possible to design the antenna strands with relatively short dimensions, so that by means of this measure, the risk of covering the antenna strands by grasping the chip card can be further minimized.

If, according to a particularly preferred embodiment, the terminal arrangement for connecting the antenna conductor structure to the chip is designed as a loop dipole having a coupling conductor section being disposed in parallel to a coupling conductor section of the antenna conductor structure, which connects the antenna strands of the antenna conductor structure with one another, it is possible to dispose the terminal arrangement, respectively the chip contacted with the terminal arrangement, laterally with respect to the antenna strands of the antenna conductor structure, resulting in that the antenna strands can be laid even more closer to the lateral edge of the substrate surface.

In this context, it proves to be particularly advantageous if the coupling conductor section of the terminal arrangement and the coupling conductor section of the antenna conductor structure are arranged at a corner region of the substrate surface, since in this way, for forming the antenna strands, substantially the entire length of a transverse side and a longitudinal side of a chip card blank, respectively of the substrate surface, is available.

If, in this connection, the coupling conductor sections each feature two coupling arms being disposed at an angle to one another and extending in parallel to a lateral edge of the substrate surface, a positioning of the antenna arrangement is realized, wherein both the antenna strands and the terminal arrangement are disposed at the largest possible distance from the center region of the substrate surface.

If the terminal arrangement has at least two planarly formed terminal contacts which extend over substrate recesses being open towards a substrate rear side, it is possible to position the chip at the smallest possible distance from the neutral bending plane of the card substrate, and thus to shift the actual contacting region between the terminal contacts of the terminal arrangement and the chip contacts virtually into the neutral plane, i.e. into an inner region of the card substrate remaining essentially unstressed upon exposure to bending stresses. Hence, the mechanical bending stresses both occurring in the connecting region and acting on the chip can be minimized.

If the terminal contacts are applied to the card substrate integrally with the coupling conductor section of the terminal arrangement in the form of a material coating using a coating process, the need for forming fragile connecting points between the terminal contacts and the coupling conductor section can also be dispensed with.

It generally proves to be advantageous if the antenna conductor structure and the terminal arrangement formed therein are formed of a congruent material coating, since thus the entire antenna conductor structure can be produced in a single coating process.

If the terminal arrangement is formed of aluminum or an alloy containing aluminum, in particular in the instance where the chip being provided for the contacting with the terminal arrangement also features terminal contacts made of aluminum or an alloy containing aluminum, a direct contacting of the chip terminal faces with the terminal contacts of the terminal arrangement can be carried out using an ultrasonic welding process.

If the terminal arrangement is formed of copper or an alloy containing copper, a contacting with a chip by means of a conventionally utilized thermal bonding method can be realized.

According to another advantageous embodiment, the terminal arrangement can be formed on a chip carrier being designed separately from the card substrate, so that a contacting with the chip can be performed independently of the card substrate.

In this case too, the terminal arrangement can be formed from a material coating applied to the chip carrier using a coating process.

In particular it proves to be advantageous to form the dipole arrangement disposed on the card substrate from at least one wire conductor, in order to produce the dipole arrangement for instance by laying the wire conductor on the surface of the card substrate.

According to the invention, the transponder arrangement is equipped with an antenna arrangement being disposed on a card substrate, wherein the card substrate on its rear side is provided with a chip module, comprising a chip being arranged on a chip carrier in such a manner that, for electrically connecting the chip with the terminal arrangement of the antenna conductor structure, the chip carrier is contacted with the terminal contacts of the terminal arrangement via chip carrier contacts extending into the substrate recesses.

The inventive transponder arrangement thus not only enables a positioning of the antenna arrangement in a region which is most likely to remain uncovered by the thumb and the fingers when the chip card is grasped, but also enables an arrangement of the chip and the connecting region formed between the terminal arrangement of the antenna conductor structure and the chip carrier contacts directly adjacent to, respectively in the neutral plane of, the card substrate.

If, according to an advantageous embodiment, the chip carrier contacts and the terminal contacts are formed of aluminum or an alloy containing aluminum, a direct contacting of the contacts is enabled by exposure to ultrasound.

Arranging the chip on the same surface of the chip carrier as the chip carrier contacts makes it possible to arrange the chip directly adjacent to the substrate surface.

If, in addition, the chip is arranged so as to engage into a substrate recess formed in the card substrate for accommodating the chip, it is possible to arrange the chip as such in the neutral plane of the card substrate.

If, in addition, the substrate recesses for the engagement of the chip carrier contacts and the substrate recess for accommodating the chip are disposed to as to be essentially flush with respect to one another, a particularly small configuration of the chip carrier is realizable, so that the chip carrier along with the chip can be disposed as close as possible to the lateral edge of the card substrate.

According to the invention, the card substrate on its surface is equipped with a chip carrier in such a manner that the coupling section of the terminal arrangement is disposed in a coupling section so as to be defined with respect to the coupling section of the dipole arrangement. The defined arrangement can be performed by an electrically conductive contacting or for instance also by a defined spacing-apart of the coupling sections for performing a contactless coupling.

In particular the defined spacing-apart can be performed in a laminate structure between the card substrate and the chip carrier.

BRIEF DESCRIPTION OF THE DRAWINGS

Hereinafter, preferred embodiments of the antenna arrangement and an embodiment of the transponder arrangement will be described in more detail with reference to the drawings.

In the drawings.

DETAILED DESCRIPTION OF THE EXAMPLE EMBODIMENTS

Figure 1:
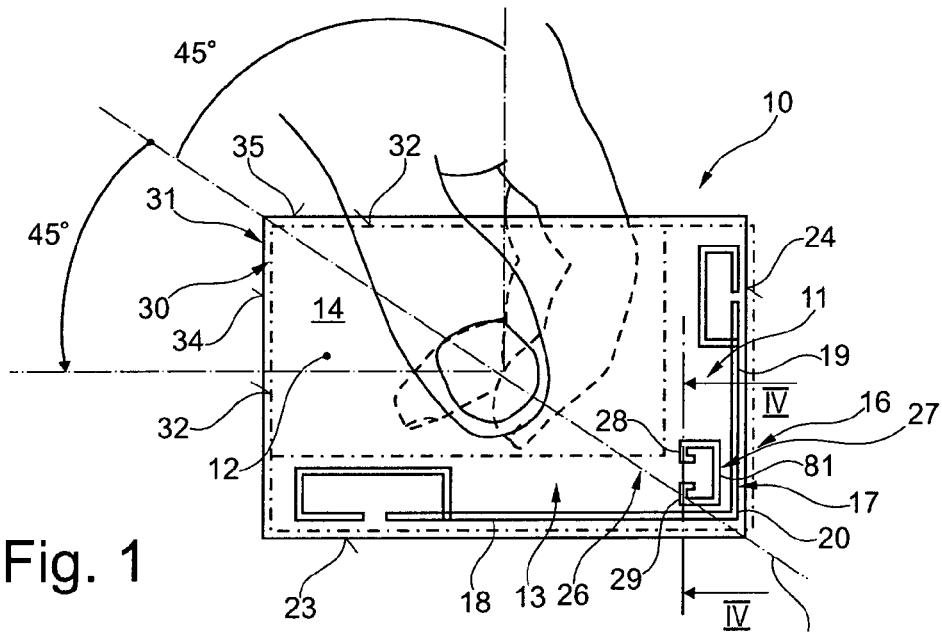
FIG. 1 shows a card substrate of a chip card during handling.

FIG. 1 shows a card substrate 10 having the form and the dimensions of a chip card. In the chip card, which is not illustrated here in detail, the card substrate 10 illustrated in FIG. 1 forms a layer of the chip card which is typically produced as a laminate structure, wherein the layer formed by the card substrate 10 is arranged between outer cover layers, which are not illustrated here in detail.

The card substrate 10 illustrated in FIG. 1 has a substrate surface 11 which is divided into a grasping zone 12 and a transponder zone 13. Here, the grasping zone 12 designates the region in which at least partial covering of the substrate surface 11 on a frontal side 14 by a thumb and on a rear side 15 by one or more fingers of the same hand is caused when a card user grasps the card substrate 10, respectively the chip card, as is indicated in FIG. 1.

In the card substrate illustrated in FIG. 1, the transponder zone 13 is essentially designed with an L-shape and accommodates an antenna conductor structure 16, which has two antenna strands 18 and 19 forming a dipole arrangement 17 and being integrally connected to one another via a coupling conductor section 20. The antenna strands 18, 19 at their free ends each have open conductor loops, respectively conductor frames 21, 22, which in the case at hand are designed with different sizes.

The dipole arrangement 17 of the antenna conductor structure 16 in the exemplary embodiment illustrated in FIG. 1 with the here comparatively longer designed antenna strand 18 extends longitudinally along a longitudinal lateral edge 23 of the card substrate 10, and the comparatively shorter designed antenna strand 19 extends longitudinally along a transverse lateral edge 24 of the card substrate 10 in such a manner that the coupling conductor section 20 connecting the antenna strands 18, 19 is disposed adjacent to the longitudinal lateral edge 23 and the transverse lateral edge 24 in a corner region 25 of the card substrate. In the corner region 25, a terminal arrangement 26 of the antenna conductor structure 16 is also disposed, which in the case at hand is designed as a loop dipole having an essentially U-shaped conductor arrangement 27, which at its free ends is equipped with planarly formed terminal contacts 28 and 29. The terminal contacts 28 and 29 serve for contacting with a chip, which is not illustrated in FIG. 1.

The entire antenna conductor structure 16, comprising the dipole arrangement 17 and the terminal arrangement 26, is formed from a metallic coating, for instance containing aluminum or copper, being applied to the substrate surface 11 of the card substrate 10. Said coating can be applied in coating processes known from the state of the art, i.e. for instance in an etching process or a printing process. The material used for the card substrate in particular may be a plastic material, such as PVC, PETG, polycarbonate or the like.

Irrespective of the material selected for the coating and the application method for applying the coating on the substrate surface 11, in the exemplary embodiment of the antenna conductor structure 16 illustrated in FIG. 1, the terminal arrangement 26 and the dipole arrangement 17 interact in such a manner that an electromagnetic coupling is created between the terminal arrangement 26 and the dipole arrangement 17 in the region of the coupling conductor section 20 of the dipole arrangement 17 and a coupling conductor section 81 of the terminal arrangement 26. By means of this aspect, it is possible to carry out a transmission of receiving or transmitting frequencies between the dipole arrangement 17 of the antenna conductor structure 16 and a chip which is contacted with the terminal contacts 28, 29 of the terminal arrangement 26 and which is not illustrated here in greater detail, essentially unaffected by disruptive contact points, as a result of the electromagnetic and thus contactless coupling.

As is apparent from the illustration according to FIG. 1, the formation of the grasping zone 12 with a corner region 30 of the grasping zone 12 coinciding with a corner region 31 of the substrate surface 11, and with lateral edges 32, 33 of the grasping zone 12 which are formed by lateral edges 34, 35 of the substrate surface 11, enables large variability in the access to the card substrate 10 without causing a covering of portions of the dipole arrangement 17 by the thumb or the fingers of the grasping hand. Thus, starting from the positioning of the hand exemplarily illustrated in FIG. 1, swiveling of the hand by +/−45° with respect to a card diagonal line 36 can be readily performed without causing such covering.

Figure 2:
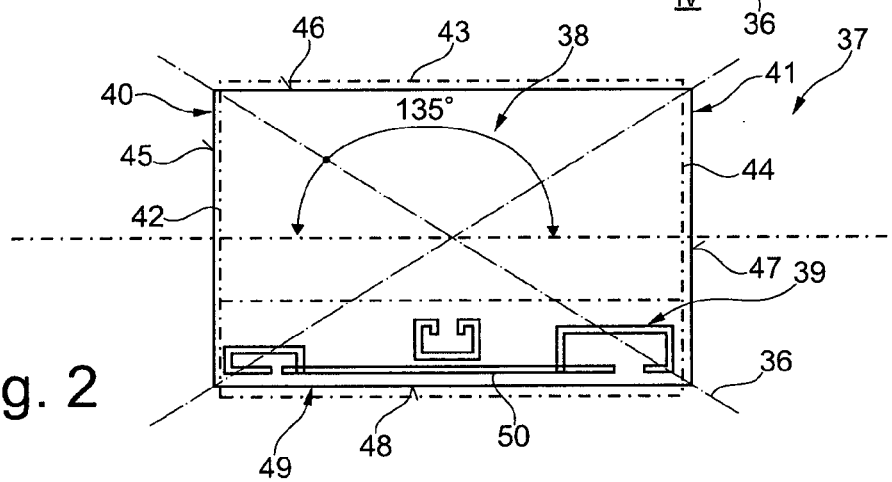
FIG. 2 shows another embodiment of the card substrate.

FIG. 2 shows a card substrate 37 having a grasping zone 38 and a transponder zone 39, wherein the grasping zone 38 extends over two adjacent corner regions 40 and 41 and has three lateral edges 42, 43, 44 which are formed by lateral edges 45, 36, 47 of the substrate surface 11.

Here, the transponder zone 39 being designed as a strip extends longitudinally along a further lateral edge 48 of the substrate surface 11 and accommodates an antenna conductor structure 49 which has a dipole arrangement 50 extending in a rectilinear fashion longitudinally along the lateral edge 48.

As is apparent from a comparison of FIGS. 1 and 2, the embodiment of the card substrate 37 illustrated in FIG. 2 enables variability of the grasping position with respect to the card diagonal line 26 between −45° and +135°.

Figure 3:
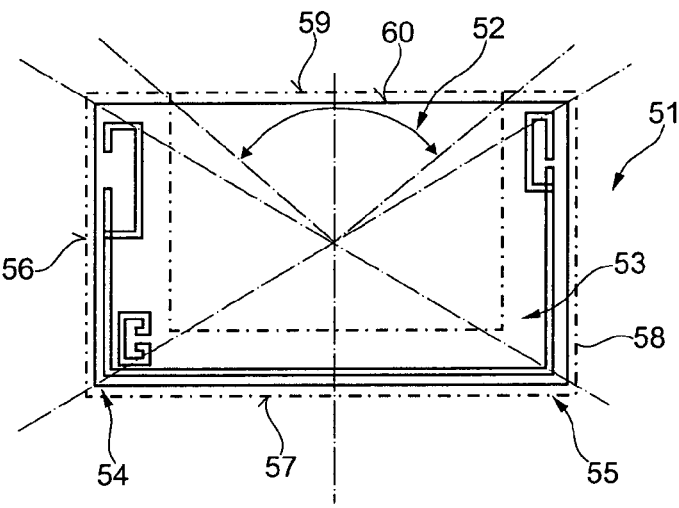
FIG. 3 shows a further embodiment of the card substrate.

FIG. 3 in another embodiment shows a card substrate 51 having a grasping zone 52 and a transponder zone 53 which is essentially designed in a U-shape and which extends over two adjacent corner regions 54, 55 of the substrate surface 11 and extends longitudinally along lateral edges 56, 57 and 58 being assigned to said edge regions. The grasping zone thus only features one lateral edge 59 which is freely accessible from the outside of the card substrate 51 and which is formed by a lateral edge 60 of the substrate surface 11. However, said grasping zone just like the grasping zones 12 and 38 in the embodiments of the card substrate 10 and 37 illustrated in FIGS. 1 and 2, extends in the card depth beyond the center region 61.

A comparison of the card substrate 51 illustrated in FIG. 3 with the card substrates 10 and 37 illustrated in FIGS. 1 and 2 reveals that the grasping zone 52 also enables variability in the access to the card substrate 51 still in the range of essentially +/−30° with respect to a center axis 62 of the card substrate 51.

Figure 4:
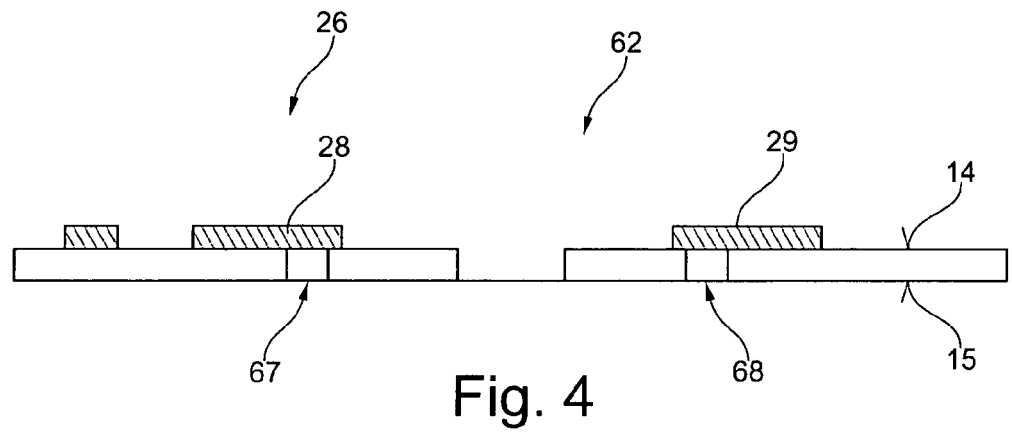
FIG. 4 shows a cross-sectional view of the card substrate illustrated in FIG. 1 longitudinally along intersection line IV-IV in FIG. 1.
Figure 5:
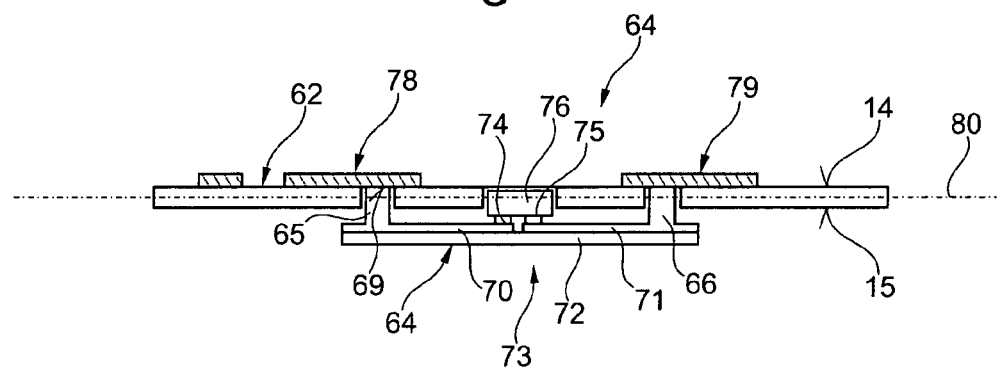
FIG. 5 shows the card substrate illustrated in FIG. 4 in a cross-sectional view having a chip module for forming a transponder.

FIGS. 4 and 5 show a longitudinal cross-section of the card substrate 10 illustrated in FIG. 1, wherein FIG. 4 illustrates the card substrate 10 having the antenna conductor structure 16 formed thereon, and the illustration according to FIG. 5 shows the antenna conductor structure 16 being contacted with a chip module 63 for the formation of a transponder module 64.

From a combined view of FIGS. 4 and 5 it is rendered apparent that the chip module 63 for contacting with the terminal contacts 28, 29 of the terminal arrangement 26 engages into substrate recesses 67, 68 via raised chip carrier contacts 65, 66, and from the rear side 15 of the card substrate 10 is connected to a contact rear side 69 of the terminal contacts 28, 29. The chip carrier contacts 65, 66 are each connected to a first and a second terminal conductor 70, 71 which are here also arranged on a substrate 72, here formed as a foil, of a strip-shaped chip carrier 73 in the form of a conductive metal coating comparable to the antenna conductor structure 16. The ends of the terminal conductor 70, 71 facing one another are contacted with chip contacts 74, 75 of a chip 76 which is positioned on the same side of the chip carrier 73 as the chip carrier contacts 65 and 66 and which engages into a substrate recess 77 formed in the card substrate 10 as a chip accommodation.

As is evident from the illustration according to FIG. 5, the protruding contacting, respectively arrangement, of the chip 76 with the terminal arrangement 26 of the antenna conductor structure 16 enables a positioning of contact points 78, 79 formed between the chip carrier contacts 65, 66 and the terminal contacts 28, 29 of the terminal arrangement 26 as well as of the chip 76 in the region of a neutral bending plane 80, wherein tensions occurring upon exposure of the card substrate 10 to bending stresses are minimal.

Figure 6:
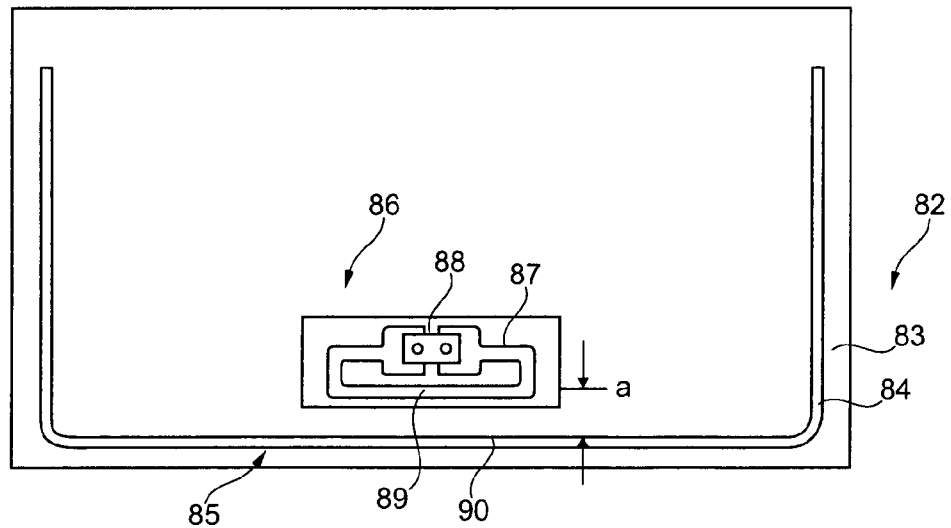
FIG. 6 shows a chip carrier arranged in a laminate structure having a card substrate.

FIG. 6 shows a transponder arrangement 82 having a card substrate 83, which on its surface has a dipole arrangement 85 formed from a wire conductor 84. On the surface of the card substrate 83, a chip carrier or a chip substrate 86 are also arranged, on which a chip 88 contacted with a terminal arrangement 87 is arranged as well. The terminal arrangement 87 has a coupling section 89 which is oriented in parallel to a coupling section 90 of the dipole arrangement 85 being disposed on the card substrate 83 and is oriented at a defined distance a and thus enables coupling between the loop dipole formed by the terminal arrangement 87 and the dipole arrangement 85.

For setting the distance a, where required, the chip carrier 86 may be applied to the card substrate 83 provided with the dipole arrangement 85 or the dipole arrangement 85 may be applied to the card substrate 83 provided with the chip carrier 86 beforehand.

The invention claimed is:

1. An antenna arrangement for a chip card, said antenna arrangement comprising:
an antenna conductor structure that is formed from a surface conductor, wherein the antenna conductor structure comprises a dipole arrangement that is arranged on a card substrate and that has a first antenna strand and a second antenna strand, and the antenna conductor structure comprises a terminal arrangement for connecting the antenna conductor structure to a chip and for forming a transponder comprising the antenna conductor structure and the chip, wherein a surface of the card substrate is divided into a grasping zone for handling the chip card and a transponder zone for arranging the transponder in such a manner that the grasping zone extends beyond a center region of the substrate surface and at least one lateral edge of the grasping zone is formed by a lateral edge of the substrate surface.

2. The antenna arrangement according to claim 1, in which a corner region of the grasping zone coincides with a corner region of the substrate surface.

3. The antenna arrangement according to claim 2, in which a lateral edge of the grasping zone is defined by a lateral edge of the substrate surface in such a manner that two corner regions of the grasping zone and of the substrate surface coincide, which corner regions are connected to one another via the lateral edge of the grasping zone.

4. The antenna arrangement according to claim 1, in which the antenna strands at their free ends are designed as open conductor frames.

5. The antenna arrangement according to claim 1, in which the terminal arrangement for connecting the antenna conductor structure to the chip is designed as a loop dipole having a coupling conductor section being disposed in parallel to a coupling conductor section of the antenna conductor structure, which connects the antenna strands of the antenna conductor structure with one another.

6. The antenna arrangement according to claim 5, in which the coupling conductor section of the terminal arrangement and the coupling conductor section of the antenna conductor structure are disposed in a corner region of the substrate surface.

7. The antenna arrangement according to claim 6, in which the coupling conductor sections respectively feature two coupling arms which are disposed at an angle with respect to one another and which each extend in parallel to a lateral edge of the substrate surface.

8. The antenna arrangement according to claim 1, in which the terminal arrangement features at least two planarly formed terminal contacts which extend over substrate recesses being open towards a substrate rear side.

9. The antenna arrangement according to claim 8, in which the terminal contacts are applied to the card substrate integrally with the coupling conductor section of the terminal arrangement in the form of a material coating using a coating process.

10. A transponder arrangement having an antenna arrangement according to claim 8, wherein the card substrate on its rear side is provided with a chip module which comprises a chip being arranged on a chip carrier in such a manner that, for electrically connecting the chip to the terminal arrangement of the antenna conductor structure, the chip carrier is contacted with the terminal contacts of the terminal arrangement via chip carrier contacts extending into the substrate recesses.

11. The transponder arrangement according to claim 10, in which the chip carrier contacts and the terminal contacts are formed of aluminum or an alloy containing aluminum.

12. The transponder arrangement according to claim 10, in which the chip is disposed on the same surface of the chip carrier as the chip carrier contacts.

13. The transponder arrangement according to claim 12, in which the chip engages into a substrate recess formed in the card substrate for accommodating the chip.

14. The transponder device according to claim 13, in which the substrate recesses for engagement with the chip carrier contacts and the substrate recess for accommodating the chip are essentially disposed flush with respect to one another.

15. The antenna arrangement according to claim 1, in which the antenna conductor structure and the terminal arrangement are formed of a congruent material coating.

16. The antenna arrangement according to claim 1, in which the terminal arrangement is made of aluminum or an alloy containing aluminum.

17. The antenna arrangement according to claim 1, in which the terminal arrangement is made of copper or an alloy containing copper.

18. The antenna arrangement according to claim 1, in which the terminal arrangement is disposed on a chip carrier which is formed separately from the card substrate.

19. The antenna arrangement according to claim 18, in which the terminal arrangement is formed from a material coating applied to the chip carrier using a coating process.

20. The antenna arrangement according to claim 18, in which the dipole arrangement being disposed on the card substrate is formed from at least one wire conductor.

21. The transponder arrangement having an antenna arrangement according to claim 18, wherein the card substrate on its surface is provided with the chip carrier in such a manner that the coupling section of the terminal arrangement is disposed in a coupling region so as to be defined with respect to the coupling section of the dipole arrangement.

22. The transponder arrangement according to claim 21, characterized in that the card substrate and the chip carrier form a laminate structure.

23. An antenna arrangement for a chip card, said antenna arrangement comprising:
   a card substrate having a substrate surface with a center region and a lateral edge, said card substrate including a grasping zone and a transponder zone, said grasping zone extending beyond the center region of the substrate surface and at least one lateral edge of the grasping zone being formed by the lateral edge of the substrate surface, said transponder zone containing a transponder; and
   an antenna conductor structure including a dipole arrangement and a terminal arrangement, said dipole arrangement having a first antenna strand and a second antenna strand arranged on the card substrate in the transponder zone, and said terminal arrangement connecting the antenna conductor structure to a chip and forming the transponder comprising the antenna conductor structure and the chip.

* * * * *

UNITED STATES PATENT AND TRADEMARK OFFICE
CERTIFICATE OF CORRECTION

PATENT NO. : 8,669,910 B2  Page 1 of 1
APPLICATION NO. : 12/994089
DATED : March 11, 2014
INVENTOR(S) : Rietzler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 641 days.

Signed and Sealed this
Twenty-ninth Day of September, 2015

Michelle K. Lee
*Director of the United States Patent and Trademark Office*